US009929030B2

(12) United States Patent
Wakabayashi

(10) Patent No.: US 9,929,030 B2
(45) Date of Patent: Mar. 27, 2018

(54) SUBSTRATE PROCESSING DEVICE AND SUBSTRATE TRANSFER METHOD

(71) Applicant: TOKYO ELECTRON LIMITED, Tokyo (JP)

(72) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 227 days.

(21) Appl. No.: 14/441,520

(22) PCT Filed: Nov. 12, 2013

(86) PCT No.: PCT/JP2013/080970
§ 371 (c)(1),
(2) Date: May 8, 2015

(87) PCT Pub. No.: WO2014/077379
PCT Pub. Date: May 22, 2014

(65) Prior Publication Data
US 2015/0303083 A1 Oct. 22, 2015

(30) Foreign Application Priority Data

Nov. 14, 2012 (JP) ................................. 2012-250325

(51) Int. Cl.
*H01L 21/677* (2006.01)
*H01L 21/67* (2006.01)

(52) U.S. Cl.
CPC .. *H01L 21/67259* (2013.01); *H01L 21/67126* (2013.01); *H01L 21/67739* (2013.01); *H01L 21/67742* (2013.01); *H01L 21/67748* (2013.01)

(58) Field of Classification Search
CPC ..... B25J 9/04; B25J 9/041; B25J 9/042; B25J 9/1015; B25J 9/162; B25J 9/1638;
(Continued)

(56) References Cited

U.S. PATENT DOCUMENTS

| 7,880,155 B2 | 2/2011 | Krupyshev et al. |
| 2012/0141235 A1 | 6/2012 | Krupyshev et al. |
| 2013/0180448 A1* | 7/2013 | Sakaue ............ H01L 21/67739 |
| | | 118/696 |

FOREIGN PATENT DOCUMENTS

| JP | 64-48443 A | 2/1989 |
| JP | 2001-110873 A | 4/2001 |

(Continued)

OTHER PUBLICATIONS

International Search Report dated Jan. 14, 2014 issued in International Application No. PCT/JP2013/080970.

*Primary Examiner* — Anna M Momper
*Assistant Examiner* — Brendan P Tighe
(74) *Attorney, Agent, or Firm* — Nath, Goldberg & Meyer; Jerald L. Meyer; Stanley N. Protigal

(57) ABSTRACT

Provided is a substrate processing device capable of improving throughput without increasing the operation speed of a drive device. Vacuum processing chambers which house a wafer for plasma processing of the wafer are respectively provided with gate valves for opening and closing a wafer inlet/outlet port, and wafer detection sensors for detecting the wafer moving forward or backward through the wafer inlet/outlet port, and a scara robot for making extending/retracting motion and rotating motion transfers the wafer. At this time, the scara robot starts the rotating motion to transfer the wafer picked up from the vacuum processing chamber in response to a trigger signal transmitted from the wafer detection sensor. The trigger signal indicates that the wafer has passed through the wafer inlet/outlet port and has arrived at a point where the gate valve and the wafer inlet/outlet port no longer interfere with the wafer.

17 Claims, 6 Drawing Sheets

(58) Field of Classification Search
CPC ...... B25J 9/1641; B25J 9/1694; B25J 9/1697;
B25J 13/08; B25J 13/089; B65G 49/07;
H01L 21/67742; H01L 21/67745; H01L
21/67748; H01L 21/68; H01L 21/681;
H01L 21/68707
USPC .... 414/217, 222.02, 222.13, 226.04, 226.05,
414/744.2, 744.3, 744.4, 744.5, 805, 806,
414/936
See application file for complete search history.

(56) References Cited

FOREIGN PATENT DOCUMENTS

| | | |
|---|---|---|
| JP | 2001-515655 A | 9/2001 |
| JP | 2002-43394 A | 2/2002 |
| JP | 2011-514652 A | 5/2011 |
| KR | 1020100092893 A | 8/2010 |

* cited by examiner

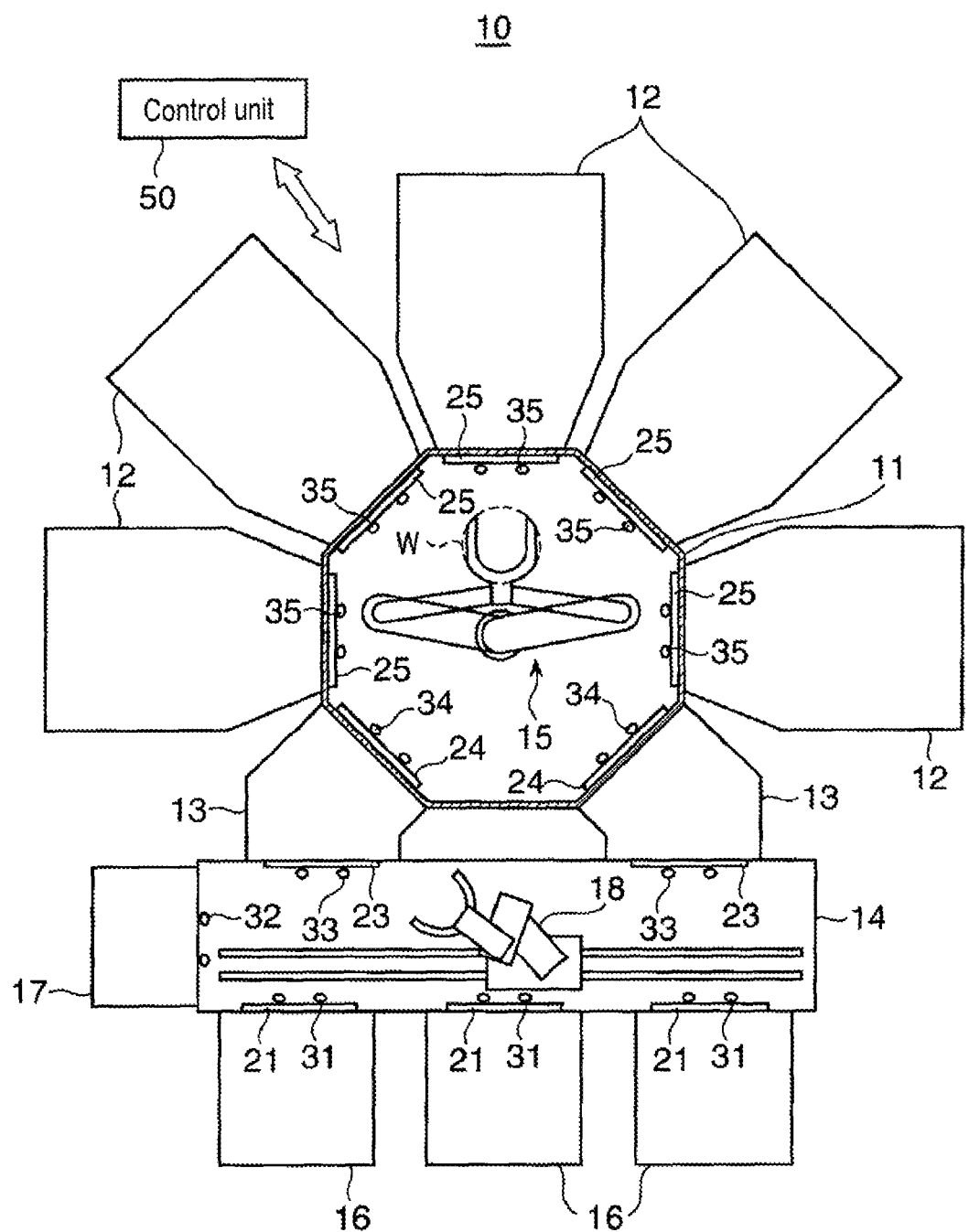

(Absence of positional deviation)    (Presence of positional deviation)

1

SUBSTRATE PROCESSING DEVICE AND SUBSTRATE TRANSFER METHOD

This is a National Phase Application filed under 35 U.S.C. 371 as a national stage of PCT/JP2013/080970, filed Nov. 12, 2013, an application claiming the benefit of Chinese Application No. 2012-250325, filed Nov. 14, 2012, the content of each of which is hereby incorporated by reference in its entirety.

TECHNICAL FIELD

The present disclosure relates to a substrate processing apparatus and a substrate transfer method in a substrate processing apparatus.

BACKGROUND

As a plasma processing apparatus for performing a plasma process on substrates such as semiconductor wafers, an apparatus including: a loader module maintained in an atmospheric pressure environment to load and unload semiconductor wafers into and from a FOUP that is a container having a plurality of semiconductor wafers accommodated therein between a load port for mounting the FOUP and a processing module (vacuum processing chamber) for performing a plasma process on semiconductor wafers; a transfer module maintained in a vacuum environment to load and unload semiconductor wafers into and from the processing module; and a load lock module disposed between the loader module and the transfer module and being selectively switchable between the atmospheric pressure environment and the vacuum environment has been used. In such a plasma processing apparatus, a first wafer transfer unit is disposed in the loader module, and a second wafer transfer unit is disposed in the transfer module. The wafer transfer units transfer semiconductor wafers between the load port and the processing module.

As the wafer transfer unit, a unit configured to have an extendable arm and be entirely rotatable has been used. In such a wafer transfer unit, an operation of the wafer transfer unit is controlled based on detection information obtained by individually detecting, using sensors, information on a rotating operation, an extending/contracting operation of the extendable arm, information on the presence or not of a semiconductor wafer on the extendable arm, information on an opening/closing operation of gate values between the respective modules, and the like.

Specifically, after the contracting operation of the extendable arm holding a semiconductor wafer taken out from a vacuum transfer chamber is terminated, the wafer transfer unit initiates a transfer operation of the held semiconductor wafer toward the load lock module. Also, the closing operation of a gate valve for allowing the vacuum transfer chamber to be isolated from and communicate with the transfer module is initiated after the information on the contracting operation of the extendable arm and the presence or not of the semiconductor wafer is confirmed (e.g., see Patent Document 1).

PRIOR ART DOCUMENT

Patent Documents

Japanese Laid-Open Patent Publication No. (Sho) 64-48443

In order to improve a mechanical throughput of a wafer transfer system in the plasma processing apparatus described above, it is necessary to reduce the opening/closing operation time of the gate valve or the operation time of the wafer transfer unit. In order to solve this problem, the operation speed of the gate valve or the wafer transfer unit may be increased. However, when the operation speed of various drive units is increased, problems occur from the generation of vibration, deterioration of accuracy, an increase in oscillation, and the like. Hence, the realization thereof is not easy.

SUMMARY

The present disclosure provides some embodiments of a substrate processing apparatus and a substrate transfer method, which are capable of improving throughput without increasing the operation speed of a drive unit.

In order to solve the above-described problems, according to one embodiment of the present disclosure, there is provided a substrate processing apparatus, including: a plurality of substrate processing units each including a chamber configured to accommodate a substrate therein, an opening/closing member configured to open and close a substrate loading/unloading port of the chamber, and a substrate detection sensor configured to detect a substrate advanced or retreated through the substrate loading/unloading port, the plurality of substrate processing units each performing a predetermined process on the substrate in the chamber; a transfer unit configured to perform a rotating operation and/or a sliding operation for selectively accessing the plurality of substrate processing units and an extending/contracting operation for loading and unloading the substrate into and from the chamber of the accessed substrate processing unit; and a control unit configured to control operations of the substrate processing units and the transfer unit, wherein, in response to a signal received from the substrate detection sensor as a trigger, which indicates that a substrate extracted from one chamber of the plurality of substrate processing units by the extending/contracting operation of the transfer unit passes through a substrate loading/unloading port of the one chamber and arrives at a position where the substrate does not interfere with the opening/closing member and the substrate loading/unloading port, the control unit allows the transfer unit to initiate the rotating operation or the sliding operation for transferring the substrate extracted from the one chamber into another chamber of the plurality of substrate processing units.

In the present disclosure, the control unit allows the transfer unit to initiate the rotating operation or the sliding operation so that the substrate extracted from the one chamber is transferred into the other chamber and the control unit simultaneously initiates a closing operation of the opening/closing member so that the substrate loading/unloading port of the one chamber is closed.

In the present disclosure, the control unit allows the transfer unit to initiate the rotating operation or the sliding operation so that the substrate extracted from the one chamber is transferred into the other chamber and the control unit simultaneously initiates an opening operation of the opening/closing member so that the substrate loading/unloading port of the other chamber is opened.

In the present disclosure, the control unit detects a positional deviation of the substrate transferred by the transfer unit based on a signal from the substrate detection sensor, and when the positional deviation of the substrate is generated, the control unit controls at least one of the extending/ contracting operation, the rotating operation and the sliding operation of the transfer unit so that the positional deviation is corrected.

In order to solve the above-described problems, according to another embodiment of the present disclosure, there is provided a substrate processing apparatus, including: at least one substrate processing unit including a chamber configured to accommodate a substrate therein, an opening/closing member configured to open and close a substrate loading/unloading port of the chamber, and a substrate detection sensor configured to detect a substrate advanced or retreated through the substrate loading/unloading port, at least one substrate processing unit performing a predetermined process on the substrate in the chamber; a transfer unit including at least two arms respectively configured to hold the substrate and be independently extendable and contractible, the transfer unit being configured to perform a rotating operation and/or a lifting operation for loading and unloading a substrate into and from the chamber; and a control unit configured to control operations of the transfer unit, wherein, in response to a signal received from the substrate detection sensor as a trigger, which indicates that a substrate extracted from the chamber by one of the at least two arms passes through the substrate loading/unloading port of the chamber and arrives at a position where the substrate does not interfere with the opening/closing member and the substrate loading/unloading port, the control unit allows the transfer unit to initiate the rotating operation or the lifting operation for loading a substrate held by the other of the at least two arms into the chamber.

In the present disclosure, the control unit detects a positional deviation of the substrate transferred by the transfer unit based on a signal from the substrate detection sensor, and when the positional deviation of the substrate is generated, the control unit controls at least one of the extending/contracting operation, the rotating operation and the lifting operation of the transfer unit so that the positional deviation is corrected.

In order to solve the above-described problems, according to another embodiment of the present disclosure, there is provided a substrate processing apparatus, including: a substrate processing unit including a chamber configured to accommodate a substrate therein, the substrate processing unit performing a predetermined process on the substrate in the chamber; a substrate accommodating chamber configured to accommodate the substrate therein to load a substrate to be processed in the substrate processing unit from the outside and to unload a substrate which has been processed in the substrate processing unit to the outside; a chamber opening/closing member configured to open and close a substrate loading/unloading port of the chamber; a first opening/closing member configured to open and close a first substrate loading/unloading port of the substrate accommodating chamber; a first transfer unit configured to perform a rotating operation and/or a sliding operation and an extending/contracting operation for selectively accessing the substrate processing unit and the substrate accommodating chamber; a first substrate detection sensor configured to detect a substrate held by the first transfer unit to be advanced and retreated through the first substrate loading/unloading port; a second substrate detection sensor configured to detect a substrate held by the first transfer unit to be advanced and retreated through the substrate loading/unloading port of the chamber; and a control unit configured to control opening/closing operations of the chamber opening/closing member and the first opening/closing member and an operation of the first transfer unit, wherein, in response to a signal received from the first substrate detection sensor as a trigger, which indicates that a substrate extracted from the substrate accommodating chamber by the extending/contracting operation of the first transfer unit passes through the first substrate loading/unloading port and arrives at a position where the substrate does not interfere with the first opening/closing member and the first substrate loading/unloading port, the control unit allows the first transfer unit to initiate the rotating operation or the sliding operation for transferring the substrate extracted from the substrate accommodating chamber into the chamber; and, in response to a signal received from the second substrate detection sensor as a trigger, which indicates that a substrate extracted from the chamber by the extending/contracting operation of the first transfer unit passes through the substrate loading/unloading port of the chamber and arrives at a position where the substrate does not interfere with the chamber opening/closing member and the substrate loading/unloading port of the chamber, the control unit allows the first transfer unit to initiate the rotating operation or the sliding operation for transferring the substrate extracted from the chamber into the substrate accommodating chamber.

In the present disclosure, the control unit allows the first transfer unit to initiate the rotating operation or the sliding operation so that the substrate extracted from the substrate accommodating chamber is transferred into the chamber and the control unit simultaneously initiates the closing operation of the first opening/closing member so that the first substrate loading/unloading port of the substrate accommodating chamber is closed; and the control unit allows the first transfer unit to initiate the rotating operation or the sliding operation so that the substrate extracted from the chamber is transferred into the substrate accommodating chamber and the control unit simultaneously initiates the closing operation of the chamber opening/closing member so that the substrate loading/unloading port of the chamber is closed.

In the present disclosure, the control unit allows the first transfer unit to initiate the rotating operation or the sliding operation so that the substrate extracted from the substrate accommodating chamber is transferred into the chamber and the control unit simultaneously initiates the opening operation of the chamber opening/closing member so that the substrate loading/unloading port of the chamber is opened; and the control unit allows the first transfer unit to initiate the rotating operation or the sliding operation so that the substrate extracted from the chamber is transferred into the substrate accommodating chamber and the control unit simultaneously initiates the opening operation of the first opening/closing member so that the first substrate loading/unloading port is opened.

In the present disclosure, the control unit detects a positional deviation of the substrate transferred by the first transfer unit based on signals from the first and second substrate detection sensors, and when the positional deviation of the substrate is generated, the control unit controls at least one of the extending/contracting operation, the rotating operation and the sliding operation of the first transfer unit so that the positional deviation is corrected.

In order to solve the above-described problems, according to another embodiment of the present disclosure, there is provided a substrate processing apparatus, including: a substrate processing unit including a chamber configured to accommodate a substrate therein, the substrate processing unit performing a predetermined process on the substrate in the chamber; a substrate accommodating chamber configured to accommodate the substrate therein to load a substrate to be processed in the substrate processing unit from the outside and to unload a substrate which has been processed in the substrate processing unit to the outside; a first opening/closing member configured to open and close a first substrate loading/unloading port of the substrate accommodating chamber; a first transfer unit including at least two arms respectively configured to hold the substrate and be independently extendable and contractible, the first transfer unit being configured to perform a rotating operation or a lifting operation for loading and unloading a substrate into and from the chamber and the substrate accommodating chamber using the arms; a first substrate detection sensor configured to detect a substrate advanced and retreated through the first substrate loading/unloading port by the first transfer unit; and a control unit configured to control operations of the first transfer unit, wherein in response to a signal received from the first substrate detection sensor as a trigger, which indicates that a substrate extracted from the substrate accommodating chamber by one of the at least two arms passes through the first substrate loading/unloading port and arrives at a position where the substrate does not interfere with the first opening/closing member and the first substrate loading/unloading port, the control unit allows the first transfer unit to initiate the rotating operation or the lifting operation for loading a substrate held by the other of the at least two arms into the substrate accommodating chamber.

In the present disclosure, the control unit detects a positional deviation of the substrate transferred by the first transfer unit based on a signal from the first substrate detection sensor, and when the positional deviation of the substrate is generated, the control unit controls at least one of the extending/contracting operation, the rotating operation and the lifting operation of the first transfer unit so that the positional deviation is corrected.

In the present disclosure, the substrate accommodating chamber includes a second substrate loading/unloading port, the substrate processing apparatus including: a container mounting unit configured to mount a plurality of substrates to be processed in the substrate processing unit and a plurality of substrates which have been processed in the substrate processing unit; a second transfer unit configured to perform a rotating operation and/or a sliding operation for selectively accessing the container mounted in the container mounting unit and the substrate accommodating chamber and an extending/contracting operation; a second opening/closing member configured to open and close the second substrate loading/unloading port of the substrate accommodating chamber; a third opening/closing member configured to open and close a substrate loading/unloading port of the container mounted in the container mounting unit; a third substrate detection sensor configured to detect a substrate held by the second transfer unit to be advanced and retreated through the second substrate loading/unloading port; and a fourth substrate detection sensor configured to detect a substrate held by the second transfer unit to be advanced and retreated through the substrate loading/unloading port of the container mounted in the container mounting unit, wherein the control unit controls opening/closing operations of the second and third opening/closing members and an operation of the second transfer unit; in response to a signal received from the third substrate detection sensor as a trigger, which indicates that a substrate extracted from the substrate accommodating chamber by the second transfer unit passes through the second substrate loading/unloading port and arrives at a position where the substrate does not interfere with the second opening/closing member and the second substrate loading/unloading port, the control unit allows the second transfer unit to initiate the rotating operation or the sliding operation for transferring the substrate extracted from the substrate accommodating chamber into the container mounted in the container mounting unit; and in response to a signal received from the fourth substrate detection sensor as a trigger, which indicates that a substrate extracted from the container mounted in the container mounting unit by the second transfer unit passes through the substrate loading/unloading port of the container and arrives at a position where the substrate does not interfere with the third opening/closing member and the substrate loading/unloading port of the container, the control unit allows the second transfer unit to initiate the rotating operation or the sliding operation for transferring the substrate extracted from the container into the substrate accommodating chamber.

In order to solve the above-described problems, according to another embodiment of the present disclosure, there is provided a substrate transfer method in a substrate processing apparatus, including: accommodating a substrate in a chamber in each of a plurality of substrate processing units and opening and closing a substrate loading/unloading port of the chamber by an opening/closing member; detecting a substrate advanced or retreated through the substrate loading/unloading port by a substrate detection sensor; performing a predetermined process on the substrate in the chamber by each of the plurality of substrate processing units; performing, by a transfer unit, a rotating operation and/or a sliding operation for selectively accessing the plurality of substrate processing units and performing an extending/contracting operation for loading and unloading the substrate into and from the chamber of the accessed substrate processing unit; and controlling, in response to a signal transmitted by the substrate detection sensor as a trigger, which indicates that a substrate extracted from one chamber of the plurality of substrate processing units by the extending/contracting operation of the transfer unit passes through the substrate loading/unloading port of the chamber and arrives at a position where the substrate does not interfere with the opening/closing member and the substrate loading/unloading port, the transfer unit to initiate the rotating operation or the sliding operation for transferring the substrate extracted from the one chamber into another chamber of the plurality of substrate processing units.

In order to solve the above-described problems, according to another embodiment of the present disclosure, there is provided a substrate transfer method in a substrate processing apparatus, including: accommodating a substrate in a chamber of at least one substrate processing unit and opening and closing a substrate loading/unloading port of the chamber by an opening/closing member; detecting a substrate advanced or retreated through the substrate loading/unloading port by a substrate detection sensor; performing a predetermined process on the substrate in the chamber by each of the plurality of substrate processing units; using a transfer unit including at least two arms respectively configured to hold the substrate and be independently extendable and contractible, performing a rotating operation and/or a lifting operation for loading and unloading a substrate into and from the chamber using the arms; and controlling, in response to a signal received from the substrate detection sensor as a trigger, which indicates that a substrate extracted from the chamber by one of the at least two arms passes through the substrate loading/unloading port of the chamber and arrives at a position where the substrate does not interfere with the opening/closing member and the substrate loading/unloading port, the transfer unit to initiate the rotating operation or the lifting operation for loading a substrate held by the other of the at least two arms into the chamber.

In order to solve the above-described problems, according to one embodiment of the present disclosure, there is provided a substrate transfer method in a substrate processing apparatus, including: performing a predetermined process on a substrate in a chamber accommodating a substrate by a substrate processing unit; accommodating the substrate in a substrate accommodating chamber to load a substrate to be processed in the substrate processing unit from the outside and to unload a substrate which has been processed in the substrate processing unit to the outside; performing, by a transfer unit, a rotating operation and/or a sliding operation and an extending/contracting operation for selectively accessing the substrate processing unit and the substrate accommodating chamber; opening and closing a substrate loading/unloading port of the substrate accommodating chamber by a substrate accommodating chamber opening/closing member; opening and closing a substrate opening/closing port of the chamber by a chamber opening/closing member; detecting a substrate advanced and retreated through the substrate loading/unloading port of the substrate accommodating chamber by a first substrate detection sensor; and detecting a substrate advanced and retreated through the substrate loading/unloading port of the chamber by a second substrate detection sensor; and controlling, in response to a signal received from the first substrate detection sensor as a trigger, which indicates that a substrate extracted from the substrate accommodating chamber by the extending/contracting operation of the first transfer unit passes through the substrate loading/unloading port of the substrate accommodating chamber and arrives at a position where the substrate does not interfere with the substrate accommodating chamber opening/closing member and the substrate loading/unloading port of the substrate accommodating chamber, the transfer unit to initiate the rotating operation or the sliding operation for transferring the substrate extracted from the substrate accommodating chamber into the chamber; and in response to a signal received from the second substrate detection sensor as a trigger, which indicates that a substrate extracted from the chamber by the extending/contracting operation of the transfer unit passes through the substrate loading/unloading port of the chamber and arrives at a position where the substrate does not interfere with the chamber opening/closing member and the substrate loading/unloading port of the chamber, the transfer unit to initiate the rotating operation or the sliding operation for transferring the substrate extracted from the chamber into the substrate accommodating chamber.

In order to solve the above-described problems, according to another embodiment of the present disclosure, there is provided a substrate transfer method in a substrate processing apparatus, including: accommodating a substrate in a chamber in a substrate processing unit performing a predetermined process on the substrate; accommodating the substrate in a substrate accommodating chamber to load a substrate to be processed in the substrate processing unit from the outside and to unload a substrate which has been processed in the substrate processing unit to the outside; opening and closing a substrate loading/unloading port of the substrate accommodating chamber by an opening/closing member; using a transfer unit including at least two arms respectively configured to hold the substrate and be independently extendable and contractible, performing a rotating operation and/or a lifting operation for loading and unloading the substrate into and from the chamber and the substrate accommodating chamber by the transfer unit; detecting a substrate advanced and retreated by the transfer unit, through the substrate loading/unloading port of the substrate accommodating chamber by using a substrate detection sensor; and controlling, in response to a signal received from the substrate detection sensor as a trigger, which indicates that a substrate extracted from the substrate accommodating chamber by one of the at least two arms passes through the substrate loading/unloading port of the substrate accommodating chamber and arrives at a position where the substrate does not interfere with the opening/closing member and the substrate loading/unloading port of the substrate accommodating chamber, the transfer unit to initiate the rotating operation or the lifting operation for loading a substrate held by the other of the at least two arms into the substrate accommodating chamber.

According to the present disclosure, a next operation such as a rotating operation, a sliding operation, a lifting operation and so on, which are required in a drive unit such as a transfer unit or an opening/closing member installed in the substrate processing apparatus, is initiated in response to a substrate detection signal from a substrate detection sensor as a trigger. Accordingly, it is possible to improve a throughput without increasing the operation speed of the drive unit. Further, since the operation speed of the drive unit is not increased, it is possible to avoid a problem of generation of vibration, deterioration of accuracy, an increase in oscillation, and the like.

BRIEF DESCRIPTION OF THE DRAWINGS

FIG. 1 is a plan view schematically illustrating the configuration of a plasma processing apparatus according to an embodiment of the present disclosure.

DETAILED DESCRIPTION

Figure 2A:
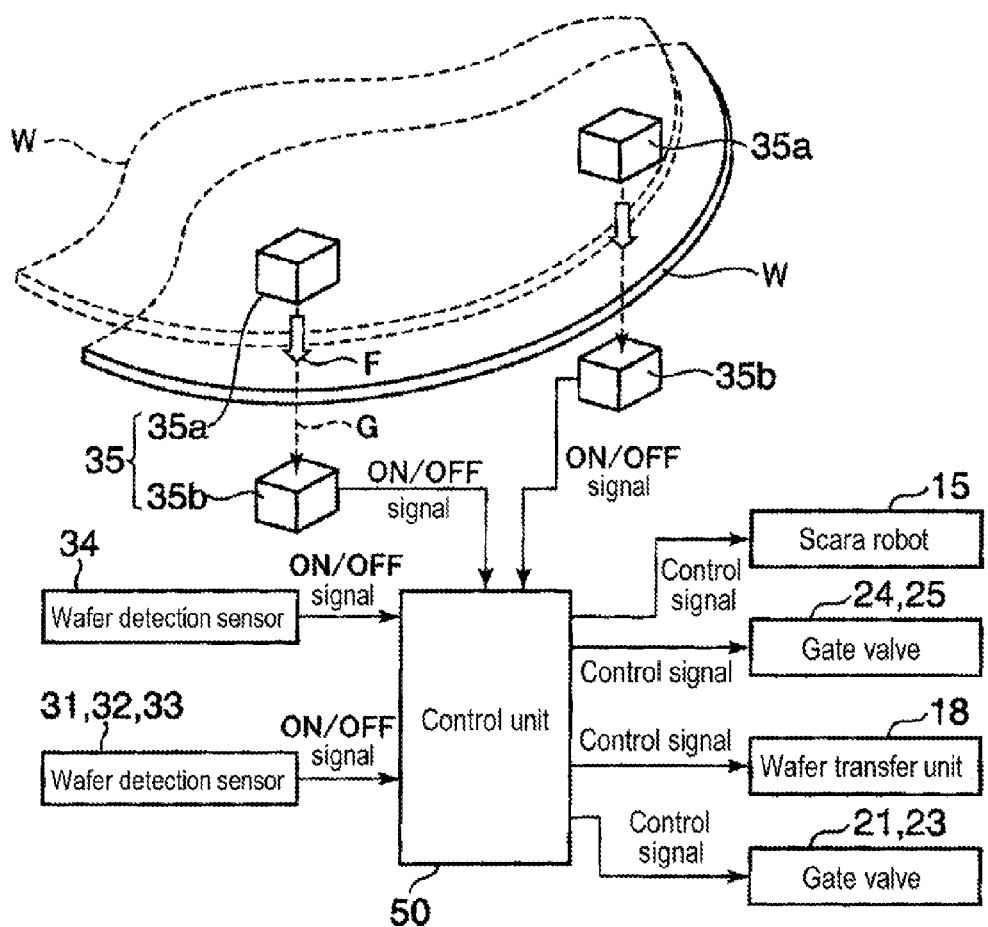
FIG. 2A is a view schematically illustrating the configuration of wafer detection sensors provided in the plasma processing apparatus of FIG. 1 and a processing flow based on detection signals output from the wafer detection sensors.

Hereinafter, embodiments of the present disclosure will be described in detail with reference to the accompanying drawings. Here, a plasma processing apparatus for performing a plasma process on a semiconductor wafer (hereinafter, referred to as a "wafer") is described as a substrate processing apparatus according to the present disclosure.

FIG. 1 is a plan view schematically illustrating the configuration of a plasma processing apparatus 10 according to a first embodiment of the present disclosure. An operation of the plasma processing apparatus 10 is controlled by a control unit 50.

The plasma processing apparatus 10 includes three load ports 16 installed to mount a FOUP that is a carrier (not shown) accommodating a predetermined number of wafers W each of which has a diameter of φ450 mm. A loader module 14 for loading/unloading the wafer W on the FOUP is disposed adjacent to the load ports 16. A position adjusting mechanism 17 for position-adjusting the wafer W is disposed adjacent to the loader module 14. Two load lock chambers (load lock modules) 13 are disposed at a side opposite to the load ports 16 with the loader module 14 interposed therebetween.

The interior of the loader module 14 is always maintained in an atmospheric pressure environment. A wafer transfer unit 18 is disposed in the loader module 14. The wafer transfer unit 18 transfers the wafer W between the FOUP mounted in the load port 16, the position adjusting mechanism 17 and the load lock chambers 13.

The load lock chamber 13 is configured so that its interior is switchable between a vacuum environment and the atmospheric pressure environment. The interior of the load lock chamber 13 becomes the atmospheric pressure environment when it communicates with the loader module 14 and becomes the vacuum environment when it communicates with the transfer module 11. The load lock chamber 13 includes a mounting table for mounting the wafer W, and lifting pins for supporting and lifting the wafer W. The lifting pins deliver and receive the wafer W between the wafer transfer unit 18 and a scara robot 15 to be described later, and also deliver and receive the wafer W to and from the mounting table.

A transfer module 11 having an octagonal shape as viewed from top is disposed at a side opposite to the loader module 14 with the load lock chambers 13 interposed therebetween. Five vacuum processing chambers (processing modules) 12 radially connected to the transfer module 11 are disposed around the transfer module 11.

The interior of the transfer module 11 is always maintained at a predetermined vacuum level (decompressed state), and the scara robot 15 for transferring the wafer W is disposed in the transfer module 11. The scara robot 15 is configured to have an extendable arm for maintaining the wafer W and be rotatable as a whole. In such a configuration, the arm of the scara robot 15 can selectively access the two load lock chambers 13 and the five vacuum processing chambers 12. The interior of a chamber constituting the vacuum processing chamber 12 is maintained at a predetermined vacuum level. The wafer W is accommodated in the interior of the chamber, thereby performing, on the wafer W, a predetermined plasma process, e.g., an etching process, an ashing process, or the like.

A gate valve 21 that is an opening/closing member for allowing the interior of the FOUP mounted in the load port 16 to communicate with and be isolated from the loader module 14 is disposed at a side of the load port 16 facing the loader module 14. Also, wafer detection sensors 31 adjacent to the gate valve 21 to detect whether the wafer W is advanced or retreated through a wafer loading/unloading port of the FOUP (i.e., to detect the presence and position of the wafer W transferred by the wafer transfer unit 18) are disposed at a side of the load port 16 facing the loader module 14. Similarly, wafer detection sensors 32 for detecting whether the wafer W is advanced or retreated through a wafer loading/unloading port of the position adjusting mechanism 17 are disposed at a side of the position adjusting mechanism 17 facing the loader module 14.

Also, a gate valve 23 for opening/closing a wafer loading/unloading port at a side of each load lock chamber 13 facing the loader module 14 and wafer detection sensors 33 for detecting whether the wafer W is advanced or retreated through the wafer loading/unloading port of the load lock chamber 13 are disposed at the side of the load lock chamber 13 facing the loader module 14. In addition, a gate valve 24 for opening/closing a wafer loading/unloading port at a side of the load lock chamber 13 facing the transfer module 11 and wafer detection sensors 34 for detecting whether the wafer W is advanced or retreated through the wafer loading/unloading port at the side of the load lock chamber 13 facing the transfer module 11 are disposed at the side of the load lock chamber 13 facing the transfer module 11. Further, a gate valve 25 for opening/closing a wafer loading/unloading port of each vacuum processing chamber 12 and wafer detection sensors 35 for detecting whether the wafer W is advanced or retreated through the wafer loading/unloading port of the vacuum processing chamber 12 are disposed at a side of the vacuum processing chamber 12 facing the transfer module 11.

The gate valves 21, 23, 24 and 25 are opened or closed as necessary when the wafer W is transferred. Configurations and functions of the wafer detection sensors 31 to 35 will be described in detail later with reference to FIGS. 2A and 2B.

In the plasma processing apparatus 10, a plasma process is performed on the wafer W in the following order. A transfer control of the wafer W in the plasma processing apparatus 10 or a plasma process control in the vacuum processing chamber 12 is performed by the control unit 50. A microcomputer (CPU) provided in the control unit 50 controls operations of various drive units constituting the plasma processing apparatus 10 by performing a predetermined program.

Here, three of the five vacuum processing chambers 12 are configured as etching processing chambers for performing a plasma etching process, and the other two are configured as ashing processing chambers for removing an etching mask formed on the wafer W through ashing. A relationship between the functions of the wafer detection sensors 31 to 35 and the transfer control of the wafer W will be described later with reference to FIG. 3 and will be omitted in the description of the following processing of the wafer W.

Although a plurality of wafers W are simultaneously processed in the plasma processing apparatus 10, the processing of one wafer W will be described here in time series. First, if the FOUP is mounted in the load port 16, the gate valve 21 installed at the load port 16 holds and opens a lid of the FOUP, so that the wafer transfer unit 18 extracts a wafer W from the FOUP, and loads the held wafer W into the position adjusting mechanism 17. The wafer W position-adjusted in the position adjusting mechanism 17 is loaded into the load lock chamber 13, which is maintained in the atmospheric pressure environment by the wafer transfer unit 18. At this time, the gate valve 24 has been closed. After the gate valve 23 at the side of the load lock chamber 13 facing the loader module 14 is closed, the load lock chamber 13 is decompressed at a predetermined vacuum level.

If the interior of the load lock chamber 13 reaches the predetermined vacuum level, the gate valve 24 is opened, so that the scara robot 15 unloads the wafer W from the load lock chamber 13 and loads the held wafer W into one etching processing chamber among the vacuum processing chambers 12. Then, an etching process on the wafer W in the etching processing chamber is performed. The wafer W, on which the process in the etching processing chamber has been terminated, is extracted from the etching processing chamber by the scara robot 15 and loaded into one ashing processing chamber among the vacuum processing chambers 12. Then, an ashing process on the wafer W in the ashing processing chamber is performed.

The wafer W, on which the ashing process has been terminated, is extracted from the ashing processing chamber by the scara robot 15 and loaded into the load lock chamber 13. At this time, the gate valve 23 has been closed. The gate valve 24 is closed, and a purge gas such as nitrogen gas is introduced into the load lock chamber 13 in order to maintain the load lock chamber 13 in the atmospheric pressure environment. At this time, the wafer W mounted on the mounting table installed in the load lock chamber 13 is cooled down to a predetermined temperature through heat exchange with the mounting table.

If the interior of the load lock chamber 13 becomes an atmospheric pressure environment and the wafer W is cooled down to the predetermined temperature, the gate valve 23 is opened, and the wafer transfer unit 18 extracts the wafer W from the load lock chamber 13 and loads the wafer W at a predetermined position of the FOUP. Accordingly, the processing of the wafer W in the plasma processing apparatus 10 is terminated.

Next, the configurations and functions of the wafer detection sensors 31 to 35 will be described with reference to FIGS. 2A and 2B. Subsequently, the relationship between the functions of the wafer detection sensors 31 to 35 and the transfer control of the wafer W in the plasma processing apparatus 10 will be described with reference to FIG. 3. Since the wafer detection sensors 31 to 35 have the same configuration and function, the wafer detection sensors 35 installed in the vicinity of the gate valve 25 of the vacuum processing chamber 12 are illustrated in FIGS. 2A and 2B.

Figure 2B:
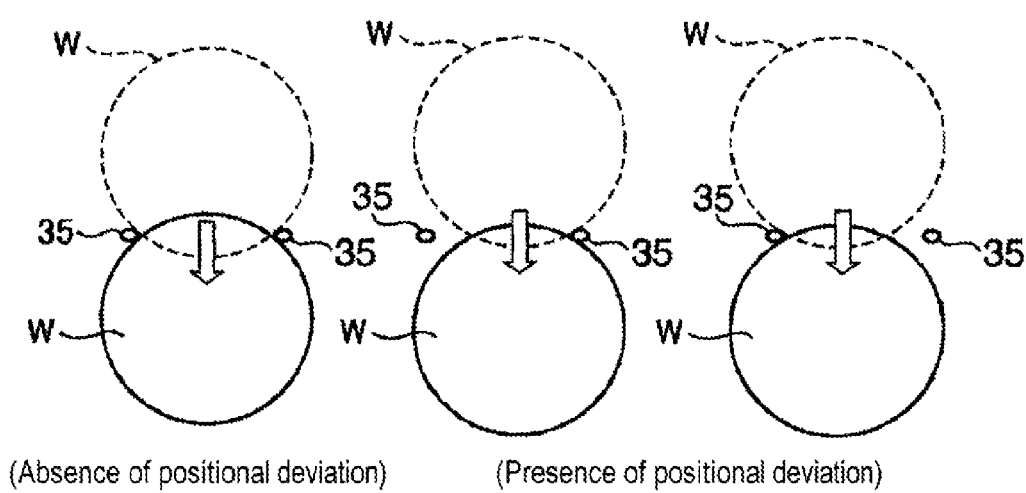
FIG. 2B is a view schematically illustrating a method of detecting a positional deviation of a wafer using the wafer detection sensors provided in the plasma processing apparatus of FIG. 1.

FIG. 2A is a view schematically illustrating the configuration of the wafer detection sensors 35 installed in the plasma processing apparatus 10 of FIG. 1 and a processing flow based on detection signals output from the wafer detection sensors 35. Additionally, FIG. 2A illustrates detection signals respectively output from the wafer detection sensors 31 to 34 and a processing flow based on the detection signals.

Each of the wafer detection sensors 35 is configured with a pair of a light emitting element 35a and a light receiving element 35b. The light emitting element 35a is, for example, a laser diode, and the light receiving element 35b is, for example, a photodiode or the like. Laser light (laser beam) is always emitted toward the light receiving element 35b from the light emitting element 35a. With this configuration, if a wafer W is present, as indicated by a solid line, between the light emitting element 35a and the light receiving element 35b, laser light F from the light emitting element 35a does not arrive at the light receiving element 35b. In this state, an OFF signal is transmitted from the light receiving element 35b to the control unit 50. Meanwhile, if any wafer W is not present, as indicated by a dashed line, between the light emitting element 35a and the light receiving element 35b, the light receiving element 35b receives laser light G from the light emitting element 35a. In this state, an ON signal is transmitted from the light receiving element 35b to the control unit 50. The ON/OFF signals may be set opposite to each other.

Therefore, when the wafer W passes between the light emitting element 35a and the light receiving element 35b, the ON/OFF signal output from the light receiving element 35b is switched. Thus, in response to the ON/OFF signal received from the light receiving element 35b as a trigger, the control unit 50 controls an operation of the scara robot 15 (an extending/contracting operation of the arm or a rotating operation of the entire robot) and opening/closing operations of the gate valves 24 and 25. Similarly, the control unit 50 controls an operation of the scara robot 15 and opening/closing operations of the gate valves 24 and 25, based on detection signals of the wafer detection sensors 34, and the control unit 50 controls an operation of the wafer transfer unit 18 and opening/closing operations of the gate valves 21 and 23, based on detection signals of the wafer detection sensors 31 to 33.

FIG. 2B is a view schematically illustrating a method of detecting a positional deviation of the wafer W using the wafer detection sensors 35 provided in the plasma processing apparatus 10 of FIG. 1. In FIG. 2B, the wafer W is held by the arm (not shown) of the scara robot 15 to move from a position indicated by a dashed line to a position indicated by a solid line. In a case where there is no positional deviation of the wafer W, if the two wafer detection sensors 35 detect the entry (presence) of the wafer W as shown in the left figure of FIG. 2B, the output signals from the two wafer detection sensors 35 are simultaneously changed from the OFF signals to the ON signals. Thereafter, if the wafer W passes through the two wafer detection sensors 35, the output signals from the two wafer detection sensors 35 are simultaneously changed from the ON signals to the OFF signals. Due to a change in the output signals, the control unit 50 can determine that any positional deviation of the wafer W has not been generated.

Meanwhile, in a case where there is a positional deviation of the wafer W as shown in the middle and right figures of FIG. 2B, one of the two wafer detection sensors 35 detects the entry (presence) of the wafer W, and the other then detects the entry of the wafer W. Hence, the output signal from the one of the two wafer detection sensors 35 is changed from the OFF signal to the ON signal, and the output signal from the other is then changed from the OFF signal to the ON signal. Similarly, when the wafer W passes through the two wafer detection sensors 35, after the output signal from one of the two wafer detection sensors 35 is changed from the OFF signal to the ON signal, the output signal from the other is changed from the ON signal to the OFF signal.

The control unit 50 detects of a positional deviation of the wafer W, based on robot encoding values of the scara robot 15 when the OFF and ON signals output from the wafer detection sensors 35 are switched. A positional deviation of a wafer W when the wafer W is loaded into and unloaded from the load lock chamber 13 is detected in this manner. In addition, for the wafer transfer unit 18, the control unit 50 adjusts the transfer position of the wafer W in the same manner.

Figure 3:
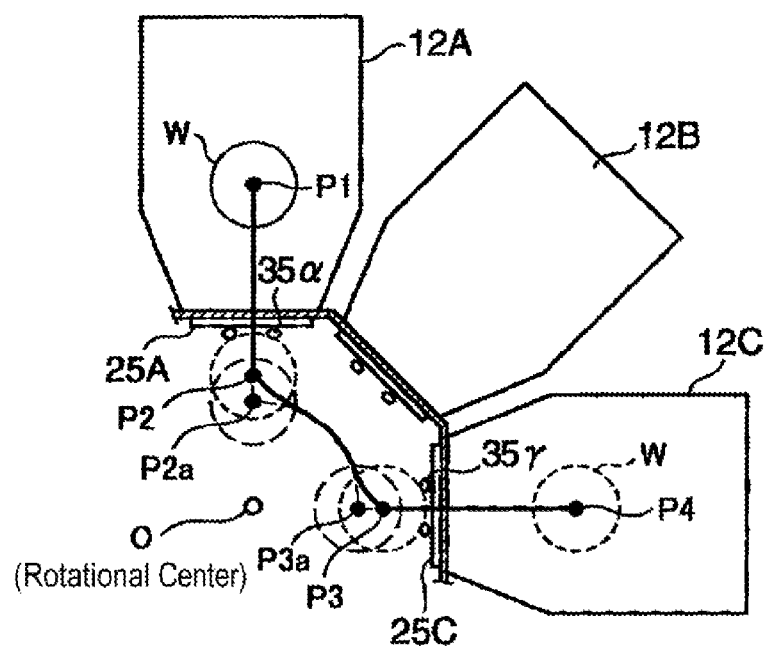
FIG. 3 is a view schematically illustrating an example showing a relationship between the detection of a wafer using the wafer detection sensors and a transfer operation of a scara robot in the plasma processing apparatus of FIG. 1.

FIG. 3 is a view schematically illustrating an example showing a relationship between the detection of a wafer W using the wafer detection sensors 35 and the transfer operation of the scara robot 15 in the plasma processing apparatus of FIG. 1. In FIG. 3, only three of the five vacuum processing chambers 12 are shown as vacuum processing chambers 12A, 12B and 12C. Here, the vacuum processing chambers 12A and 12B are configured as etching processing units, and the vacuum processing chamber 12C is configured as an ashing processing unit. In FIG. 3, the movement of the wafer W (operation of the scara robot 15) transferred from the vacuum processing chamber 12A to the vacuum processing chamber 12C is indicated by positions P1 to P4 that are center positions of the wafer W and its trace (solid line). The gate valve 25 installed to the vacuum processing chamber 12A is configured as a gate valve 25A, and the wafer detection sensors 35 installed thereto are configured as wafer detection sensors 35α. The gate valve 25 installed to the vacuum processing chamber 12C is configured as a gate valve 25C, and the wafer detection sensors 35 installed thereto are configured as wafer detection sensors 35γ.

The gate valves 25A and 25C of the vacuum processing chambers 12A and 12C have been closed. If the control unit 50 receives a signal indicating the termination of an ashing process from the vacuum processing chamber 12A, the control unit 50 opens the gate valve 25A of the vacuum processing chamber 12A, stretches the arm of the scara robot 15 to enter it into the vacuum processing chamber 12A, and holds the etched wafer W located at a position P1. Subsequently, the control unit 50 shrinks the arm of the scara robot 15, thereby extracting the held wafer W from the vacuum processing chamber 12A.

At this time, the wafer detection sensors 35α detect the movement of the wafer W. As the wafer W passes through the wafer detection sensors 35α, the output signals from the wafer detection sensors 35α are changed from the OFF signals to the ON signals and then changed from the ON signals to the OFF signals. In response to the change from the ON signal to the OFF signal as a trigger, which indicates that the wafer W passes through the gate valve 25A and arrives at a position P2 (in response to the reception of the OFF signal as a trigger), the control unit 50 initiates a rotating operation about the rotational center O of the scara robot 15, and simultaneously initiates the closing operation of the gate valve 25A. At this time, an opening operation of the gate valve 25C is also initiated, so that it is possible to suppress migration (diffusion) of particles between the transfer module 11 and the vacuum processing chamber 12A. In addition, the position P2 of the wafer W is a position at which the wafer W and the arm of the scara robot 15 do not interfere with the gate valve 25A.

Here, the contracting operation of the arm of the scara robot 15 is not stopped at a point of time when the wafer W arrives at the position P2, and the arm is expanded and contracted during the rotating operation of the scara robot 15 for moving the wafer W from the position P2 to a position P3. The contracting operation of the arm is not suddenly stopped as described above, so that it is possible to allow impact not to be applied to the held wafer W, thereby avoiding, for example, the occurrence of a positional deviation of the wafer W, or the like. In a case where any problem does not occur even when the contracting operation of the arm of the scara robot 15 is stopped and thus the wafer W is transferred to trace a circular arc from the position P2 to the position P3, the extending/contracting operation of the arm during the rotating operation of the scara robot 15 is not necessarily required.

The gate valve 25C of the vacuum processing chamber 12C has been already opened when the wafer W arrives at the position P3. Therefore, the control unit 50 allows the arm of the scara robot 15 to stretch and transfer the wafer W from the position P3 to a position P4, delivering and receiving the wafer W into and from the interior of the vacuum processing chamber 12C. In the sequence of transfer of the wafer W, when a positional deviation of the wafer W is detected by the wafer detection sensors 35α and 35γ, the control unit 50 finely adjusts the operation of the scara robot 15 to exactly transfer the wafer W to the position P4. Accordingly, the wafer W can be smoothly processed. The control unit 50 may be configured to give an alarm when the transfer of the wafer W cannot be finely adjusted.

The above-described transfer control of the wafer W according to the first embodiment is compared with a conventional transfer control. In the conventional transfer control, as indicated by a dashed line in FIG. 3, according to a predetermined sequence, after the contracting operation of the arm holding the wafer W located at the position P1 is terminated and the wafer W arrives at a position P2a, the rotating operation of the scara robot 15 is initiated. Thus, the wafer W arrives at a position P3a and the arm of the scara robot 15 is then stretched, thereby transferring the wafer W to the position P4.

Here, since the angle of the rotating operation of the scara robot 15 is constant, the time required to move the wafer W between the positions P2 and P3 through the transfer control of the wafer W according to the first embodiment is equal to the time required to move the wafer W between the positions P2a and P3a though the conventional transfer control. Thus, when the wafer W is transferred from the position P1 to the position P4 via the positions P2 and P3 by the transfer control of the wafer according to the first embodiment, since the time required to transfer the wafer between the positions P2 and P2a and between P3 and P3a is unnecessary, it is possible to reduce the transfer time of the wafer by the unnecessary portion, as compared with when the wafer W is transferred from the position P1 to the position P4 via the positions P2a and P3a by the conventional transfer control.

Further, in the conventional transfer control, since the opening operation of the gate valve 25C is initiated, for example, at the point of time when the wafer arrives at the position P3a, the arm of the scara robot 15 cannot be stretched even though the wafer W arrives at the position P3a. Therefore, a little waiting time is necessary. However, in the transfer control according to the first embodiment, since the waiting time is unnecessary, the transfer time of the wafer W can be reduced, thereby improving throughput.

In addition, as compared with the conventional transfer control, in the transfer control of the wafer W according to the first embodiment, since the operation speed of the scara robot 15 is not increased, no problems occur from the generation of vibration, deterioration of transfer accuracy, generation of oscillation, or the like. Further, since the wafer detection sensors 31 to 35 also function as sensors for correcting a transfer center position of the wafer W, which has been conventionally equipped, there is no increase in cost.

In the above description, the example of transferring (moving) the wafer W between the vacuum processing chambers 12 has been illustrated, but it will be apparent that the transfer control of the wafer W according to the first embodiment may be applied to the transfer of the wafer W between the load lock chamber 13 and the vacuum processing chamber 12. Similarly, the transfer control of the wafer W according to the first embodiment may be applied to the transfer of the wafer W between the load port 16, the position adjusting mechanism 17 and the load lock chamber 13 using the wafer transfer unit 18. In the above-described transfer control of the wafer according to the first embodiment, the operations of the scara robot 15 and the gate valves 25A and 25C are controlled in response to sensor signals of the wafer detection sensors 35α and 35γ as triggers. However, the present disclosure is not limited thereto, and a preparing operation of a plasma process in the vacuum processing chamber 12 or the like may be performed, for example, in response to sensor signals of the wafer detection sensors 34 as triggers.

In the above description, the gate valve 25 has been disposed at a side of the wafer loading/unloading port of the vacuum processing chamber 12 facing the transfer module 11. However, the gate valve 25 may be installed in the vacuum processing chamber 12. In this case, the wafer detection sensors 35 are also disposed at a side of the wafer loading/unloading port facing the loader module. With this configuration, even when the above-described transfer control of the wafer W according to the first embodiment is performed, the transfer where the wafer W interferes with the wafer loading/unloading port of the vacuum processing chamber 12 is not performed.

Figure 4:
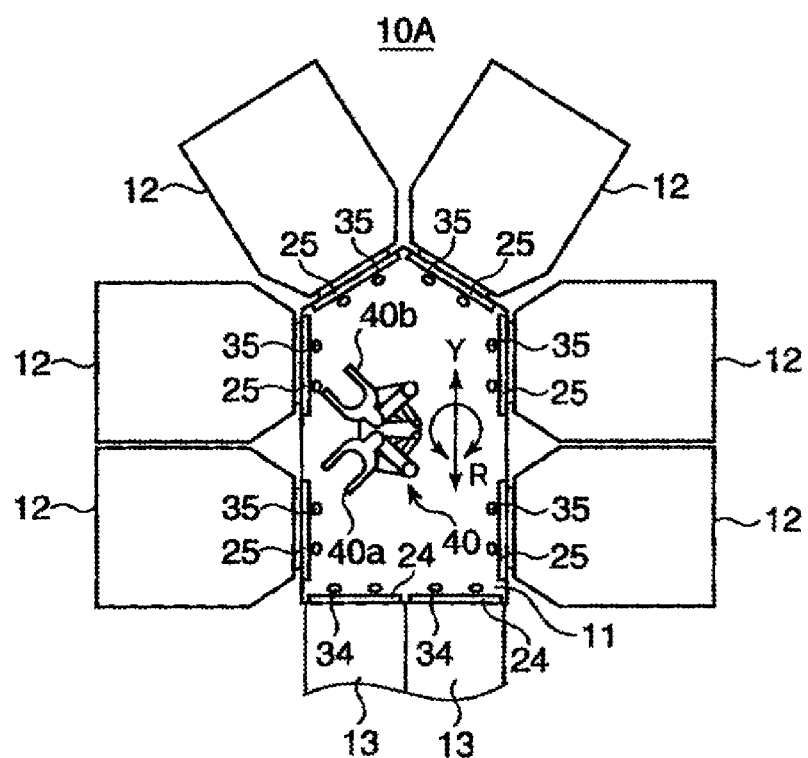
FIG. 4 is a plan view schematically illustrating the configuration of another plasma processing apparatus according to a second embodiment of the present disclosure.

Next, a plasma processing apparatus according to a second embodiment of the present disclosure will be described. FIG. 4 is a plan view schematically illustrating the configuration of another plasma processing apparatus 10A according to the second embodiment of the present disclosure. The plasma processing apparatus 10A has the same loader module 14, the same load port 16 and the same position adjusting mechanism 17 as those of the plasma processing apparatus 10 according to the first embodiment. But their illustration is omitted in FIG. 4.

The plasma processing apparatus 10A according to the second embodiment differs from the plasma processing apparatus 10 according to the first embodiment in that a scara robot 40 disposed in the transfer module 11 freely slides in the Y direction shown in FIG. 4 and also is rotatable in the direction (right turn/left turn) of an arrow R. Also, as another difference, the scara robot 40 includes two multi-joint arms 40a and 40b for holding wafers W, and two vacuum processing chambers 12 are arranged in the Y direction. In the other points, the plasma processing apparatuses 10 and 10A are not substantially different from each other. In addition, the arms 40a and 40b are independently operable.

Figure 5:
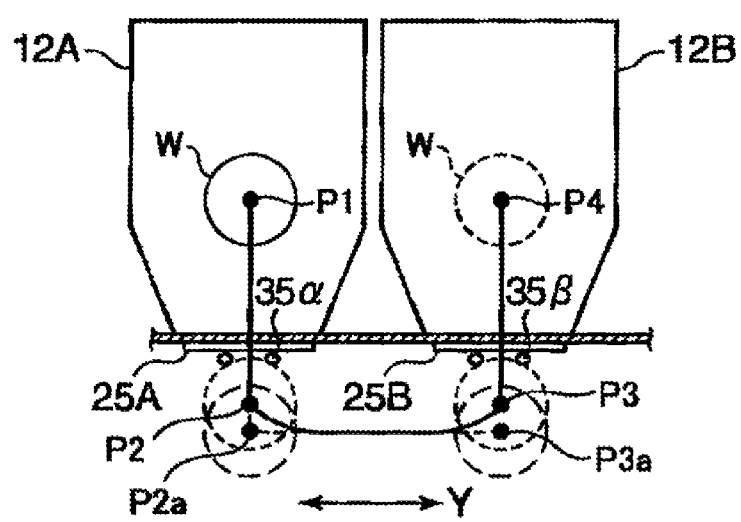
FIG. 5 is a view schematically illustrating a first example showing a relationship between the detection of a wafer W using wafer detection sensors and a transfer operation of a scara robot in the plasma processing apparatus of FIG. 4.

A relationship between the detection of the wafer W using the wafer detection sensors 35 and the transfer operation of the scara robot 40 in the plasma processing apparatus 10A will be described below. FIG. 5 is a view schematically illustrating a first example showing a relationship between the detection of the wafer W using the wafer detection sensors 35 and the transfer operation of the scara robot 40 in the plasma processing apparatus 10A of FIG. 4. In FIG. 5, only two vacuum processing chambers 12A and 12B are arranged in the Y direction among six vacuum processing chambers 12. Here, the vacuum processing chamber 12A is configured as an etching processing unit, and the vacuum processing chamber 12B is configured as an ashing processing unit.

In FIG. 5, like FIG. 3, the movement of the wafer W (operation of the scara robot 40) transferred from the vacuum processing chamber 12A to the vacuum processing chamber 12B under the control of the control unit 50 is indicated by a trace (solid line) of positions P1 to P4 via P2 and P3, which are center positions of the wafer W. In addition, the movement of the wafer W under the conventional transfer control is indicated by a dashed line (positions P1 to P4 via P2a and P3a). The gate valve 25 installed to the vacuum processing chamber 12A is configured as a gate valve 25A, and the wafer detection sensors 35 installed thereto are configured as wafer detection sensors 35α. The gate valve 25 installed to the vacuum processing chamber 12B is configured as a gate valve 25B, and the wafer detection sensors 35 installed thereto are configured as wafer detection sensors 35β.

In the same manner as described with reference to FIG. 3, in the transfer operation of the wafer W shown in FIG. 5, the gate valve 25A of the vacuum processing chamber 12A is opened, and the arm 40a (or 40b) of the scara robot 40 extracts the wafer W located at the position P1 from the vacuum processing chamber 12A. In response to signals from the wafer detection sensors 35α as triggers, which indicate that the wafer W passes through the gate valve 25A and arrives at the position P2, the scara robot 40 initiates a Y-direction slide movement toward the vacuum processing chamber 12B and simultaneously initiates the closing operation of the gate valve 25A. Also, the opening operation of the gate valve 25B is initiated. Since the gate valve 25B of the vacuum processing chamber 12B has been already opened when the wafer W arrives at the position P3, the arm 40a of the scara robot 40 transfers the wafer W from the position P3 to the position P4, so that the wafer W is loaded into the vacuum processing chamber 12B. In a case where it is detected that a positional deviation of the wafer W is generated from signals from the wafer detection sensors 35β, the scara robot 40 performs an operation correcting the positional deviation. Using such a transfer method of the wafer W, the transfer is possible for a shorter time, as compared with the conventional transfer method.

In a second example of the relationship between the detection of the wafer W using the wafer detection sensors 35 and the transfer operation of the scara robot 40 in the plasma processing apparatus 10A, the loading and unloading of the wafer W into and from one vacuum processing chamber 12 are consecutively performed by the two arms 40a and 40b. The arm 40b of the scara robot 40 is set to hold the wafer W before a plasma process is performed. In this state, the gate valve 25 of the vacuum processing chamber 12 is opened, and the arm 40a of the scara robot 40 extracts the plasma processed wafer from the vacuum processing chamber 12A. In response to signals from the wafer detection sensors 35 as triggers, which indicate that the plasma processed wafer passes through the gate valve 25, the scara robot 40 initiates an R-direction rotating operation, which is required to load the wafer W held by the arm 40b into the same vacuum processing chamber 12 as the vacuum processing chamber 12 from which the plasma processed wafer W is extracted. After the rotating operation with a predetermined angle is terminated, the arm 40b loads the held wafer W into the vacuum processing chamber 12.

By using the transfer method (loading/unloading method) of the wafer W, the transfer of the wafer W is possible for a shorter time, as compared with the conventional transfer method in which the wafer loading operation performed by the arm 40b after the wafer unloading operation of the arm 40a is completely terminated according to a sequence. Further, the same transfer method can be used for the load lock chamber 13.

In the above-described second example of the relationship between the detection of the wafer W using the wafer detection sensors 35 and the transfer operation of the scara robot 40, when the wafer W is consecutively unloaded from and loaded into one vacuum processing chamber 12 by the two arms 40a and 40b, the scara robot 40 performs a rotating operation in response to signals of the wafer detection sensors 35 as triggers, which indicate that the wafer W is unloaded from the vacuum processing chamber 12. On the other hand, the scara robot 40 may be configured so that the arm 40b is located below or above the arm 40a (at the overlapping position when viewed on the plane of FIG. 4) in a state in which the arm 40b holds the wafer W before the plasma process.

In this case, in response to signals of the wafer detection sensors 35 as trigger signals, which indicate that the wafer W is unloaded from the vacuum processing chamber 12, the arm 40b may be configured to initiate a rising or lowering operation in order to load the wafer W before the plasma process into the vacuum processing chamber 12. Accordingly, it is possible to transfer the wafer for a shorter time, as compared with the conventional transfer method. Further, the same transfer method can be used for the load lock chamber 13.

In the above, the embodiments of the present disclosure have been described, but the present disclosure is not limited thereto. For example, in the above description, the wafer W is detected by the wafer detection sensors 35, thereby controlling the operation of the scara robot 15 or 40 and the operation of the wafer transfer unit 18. However, in the scara robot 15 or 40 and the wafer transfer unit 18, the movement of the arm holding the wafer W may be detected by a sensor. Then, the operation of the scara robot 15 or 40 and the operation of the wafer transfer unit 18 may be controlled based on a signal detected by the sensor.

Although the plasma processing apparatus is used as a substrate processing apparatus, the present disclosure is not limited thereto and the plasma processing apparatus may be a film forming apparatus, a cleaning apparatus or the like. Although the semiconductor wafer is used as a substrate, the substrate is not limited thereto and may be a glass substrate used in a flat panel display (FPD) such as a liquid crystal display or the like. Thus, the present disclosure is applied to a processing apparatus of a glass substrate for FPD.

This application claims the right of priority to Japanese Patent Application No. 2012-250325, filed on Nov. 14, 2012, the contents of which is incorporated by reference herein in its entirety.

What is claimed is:

1. A substrate processing apparatus, comprising:
a plurality of substrate processing units each including a chamber configured to accommodate a substrate therein, an opening/closing member configured to open and close a substrate loading/unloading port of the chamber, and a substrate detection sensor configured to detect a substrate advanced or retreated through the substrate loading/unloading port, the plurality of substrate processing units each performing a predetermined process on the substrate in the chamber,
wherein the substrate detection sensor is positioned to detect when the substrate is extracted from one chamber of the plurality of substrate processing units and does not interfere with the opening/closing member and the substrate loading/unloading port to generate a trigger signal;
a transfer unit configured to perform a rotating operation and/or a sliding operation for selectively accessing the plurality of substrate processing units and an extending/contracting operation for loading and unloading the substrate into and from the chamber of the accessed substrate processing unit; and
a control unit configured to control operations of the substrate processing units and the transfer unit,
wherein, when the control unit receives the trigger signal, the control unit controls the transfer unit to initiate the rotating operation or the sliding operation for transferring the substrate extracted from the one chamber into another chamber of the plurality of substrate processing units.

2. The substrate processing apparatus of claim 1, wherein the control unit also initiates a closing operation of the opening/closing member so that the substrate loading/unloading port of the one chamber is closed when the control unit receives the trigger signal.

3. The substrate processing apparatus of claim 1, wherein the control unit also initiates an opening operation of the opening/closing member so that the substrate loading/unloading port of the other chamber is opened when the control unit receives the trigger signal.

4. The substrate processing apparatus of claim 1, wherein the control unit detects a positional deviation of the substrate transferred by the transfer unit based on a signal from the substrate detection sensor, and when the positional deviation of the substrate is generated, the control unit controls at least one of the extending/contracting operation, the rotating operation and the sliding operation of the transfer unit so that the positional deviation is corrected.

5. A substrate processing apparatus, comprising:
at least one substrate processing unit including a chamber configured to accommodate a substrate therein, an opening/closing member configured to open and close a substrate loading/unloading port of the chamber, and a substrate detection sensor configured to detect a substrate advanced or retreated through the substrate loading/unloading port, the at least one substrate processing unit performing a predetermined process on the substrate in the chamber,
wherein the substrate detection sensor is positioned to detect when the substrate is extracted from one chamber of the plurality of substrate processing units and does not interfere with the opening/closing member and the substrate loading/unloading port to generate a trigger signal;
a transfer unit including at least two arms respectively configured to hold the substrate and be independently extendable and contractible, the transfer unit being configured to perform a rotating operation and/or a lifting operation for loading and unloading a substrate into and from the chamber; and
a control unit configured to control operations of the transfer unit,
wherein, when the control unit receives the trigger signal caused by substrate extraction by one of the at least two arms, the control unit controls the transfer unit to initiate the rotating operation or the lifting operation for loading a substrate held by the other of the at least two arms into the chamber.

6. The substrate processing apparatus of claim 5, wherein the control unit detects a positional deviation of the substrate transferred by the transfer unit based on a signal from the substrate detection sensor, and when the positional deviation of the substrate is generated, the control unit controls at least one of the extending/contracting operation, the rotating operation and the lifting operation of the transfer unit so that the positional deviation is corrected.

7. A substrate processing apparatus, comprising:
a substrate processing unit including a chamber configured to accommodate a substrate therein, the substrate processing unit performing a predetermined process on the substrate in the chamber;
a substrate accommodating chamber configured to accommodate the substrate therein to load a substrate to be processed in the substrate processing unit from the outside and to unload a substrate which has been processed in the substrate processing unit to the outside;
a chamber opening/closing member configured to open and close a substrate loading/unloading port of the chamber;
a first opening/closing member configured to open and close a first substrate loading/unloading port of the substrate accommodating chamber;
a first transfer unit configured to perform a rotating operation and/or a sliding operation and an extending/ contracting operation for selectively accessing the substrate processing unit and the substrate accommodating chamber;

a first substrate detection sensor configured to detect a substrate held by the first transfer unit to be advanced and retreated through the first substrate loading/unloading port, wherein the first substrate detection sensor is positioned to detect when the substrate is extracted from the substrate accommodating chamber and does not interfere with the first opening/closing member and the first substrate loading/unloading port to generate a first trigger signal;

a second substrate detection sensor configured to detect a substrate held by the first transfer unit to be advanced and retreated through the substrate loading/unloading port of the chamber, wherein the second substrate detection sensor is positioned to detect when the substrate is extracted from the chamber of the substrate processing unit and does not interfere with the chamber opening/closing member and the substrate loading/unloading port of the chamber to generate a second trigger signal; and a control unit configured to control opening/closing operations of the chamber opening/closing member and the first opening/closing member and an operation of the first transfer unit, wherein, when the control unit receives the first trigger signal, the control unit controls the first transfer unit to initiate the rotating operation or the sliding operation for transferring the substrate extracted from the substrate accommodating chamber into the chamber; and, when the control unit receives the second trigger signal, the control unit controls the first transfer unit to initiate the rotating operation or the sliding operation for transferring the substrate extracted from the chamber into the substrate accommodating chamber.

8. The substrate processing apparatus of claim 7, wherein the control unit also initiates the closing operation of the first opening/closing member so that the first substrate loading/unloading port of the substrate accommodating chamber is closed when the control unit receives the first trigger signal; and the control unit also initiates the closing operation of the chamber opening/closing member so that the substrate loading/unloading port of the chamber is closed when the control unit receives the second trigger signal.

9. The substrate processing apparatus of claim 7, wherein the control unit also initiates the opening operation of the chamber opening/closing member so that the substrate loading/unloading port of the chamber is opened when the control unit receives the first trigger signal; and the control unit also initiates the opening operation of the first opening/closing member so that the first substrate loading/unloading port is opened when the control unit receives the second trigger signal.

10. The substrate processing apparatus of claim 7, wherein the control unit detects a positional deviation of the substrate transferred by the first transfer unit based on signals from the first and second substrate detection sensors, and when the positional deviation of the substrate is generated, the control unit controls at least one of the extending/contracting operation, the rotating operation and the sliding operation of the first transfer unit so that the positional deviation is corrected.

11. The substrate processing apparatus of claim 7, wherein the substrate accommodating chamber includes a second substrate loading/unloading port, the substrate processing apparatus comprising:

a container mounting unit configured to mount a container having a plurality of substrates to be processed in the substrate processing unit and a plurality of substrates which have been processed in the substrate processing unit;

a second transfer unit configured to perform a rotating operation and/or a sliding operation for selectively accessing the container mounted in the container mounting unit and the substrate accommodating chamber and an extending/contracting operation;

a second opening/closing member configured to open and close the second substrate loading/unloading port of the substrate accommodating chamber;

a third opening/closing member configured to open and close a substrate loading/unloading port of the container mounted in the container mounting unit;

a third substrate detection sensor configured to detect a substrate held by the second transfer unit to be advanced and retreated through the second substrate loading/unloading port; and a fourth substrate detection sensor configured to detect a substrate held by the second transfer unit to be advanced and retreated through the substrate loading/unloading port of the container mounted in the container mounting unit, wherein the third substrate detection sensor is positioned to detect when the substrate is extracted from the substrate accommodating chamber through the second substrate loading/unloading port by the second transfer unit and does not interfere with the second opening/closing member and the second substrate loading/unloading port to generate a third trigger signal, wherein the fourth substrate detection sensor is positioned to detect when the substrate is extracted from the container mounting unit by the second transfer unit and does not interfere with the third opening/closing member and the substrate loading/unloading port of the container to generate a fourth trigger signal, and wherein the control unit controls opening/closing operations of the second and third opening/closing members and an operation of the second transfer unit; when the control unit receives the third trigger signal, the control unit controls the second transfer unit to initiate the rotating operation or the sliding operation for transferring the substrate extracted from the substrate accommodating chamber into the container mounted in the container mounting unit; and, when the control unit receives the fourth trigger signal, the control unit controls the second transfer unit to initiate the rotating operation or the sliding operation for transferring the substrate extracted from the container into the substrate accommodating chamber.

12. A substrate processing apparatus, comprising:

a substrate processing unit including a chamber configured to accommodate a substrate therein, the substrate processing unit performing a predetermined process on the substrate in the chamber;

a substrate accommodating chamber configured to accommodate the substrate therein to load a substrate to be processed in the substrate processing unit from the outside and to unload a substrate which has been processed in the substrate processing unit to the outside;

a first opening/closing member configured to open and close a first substrate loading/unloading port of the substrate accommodating chamber;

a first transfer unit including at least two arms respectively configured to hold the substrate and be independently extendable and contractible, the first transfer unit being configured to perform a rotating operation or a lifting operation for loading and unloading a substrate into and from the chamber and the substrate accommodating chamber using the arms;

a first substrate detection sensor configured to detect a substrate advanced and retreated through the first substrate loading/unloading port by the first transfer unit, wherein the first substrate detection sensor is positioned to detect when the substrate is extracted from the substrate accommodating chamber through the first substrate loading/unloading port and does not interfere with the first opening/closing member and the first substrate loading/unloading port to generate a first trigger signal; and a control unit configured to control operations of the first transfer unit, wherein, when the control unit receives the first trigger signal caused by substrate extraction by one of the at least two arms, the control unit controls the first transfer unit to initiate the rotating operation or the lifting operation for loading a substrate held by the other of the at least two arms into the substrate accommodating chamber.

13. The substrate processing apparatus of claim 12, wherein the control unit detects a positional deviation of the substrate transferred by the first transfer unit based on a signal from the first substrate detection sensor, and when the positional deviation of the substrate is generated, the control unit controls at least one of the extending/contracting operation, the rotating operation and the lifting operation of the first transfer unit so that the positional deviation is corrected.

14. A substrate transfer method in a substrate processing apparatus, comprising:

accommodating a substrate in a chamber in each of a plurality of substrate processing units and opening and closing a substrate loading/unloading port of the chamber by an opening/closing member;

detecting a substrate advanced or retreated through the substrate loading/unloading port by a substrate detection sensor positioned to detect when the substrate is extracted from one chamber of the plurality of substrate processing units and does not interfere with the opening/closing member and the substrate loading/unloading port to generate a trigger signal;

performing a predetermined process on the substrate in the chamber by each of the plurality of substrate processing units;

performing, by a transfer unit, a rotating operation and/or a sliding operation for selectively accessing the plurality of substrate processing units and performing an extending/contracting operation for loading and unloading the substrate into and from the chamber of the accessed substrate processing unit; and controlling, when the trigger signal is generated, the transfer unit to initiate the rotating operation or the sliding operation for transferring the substrate extracted from the one chamber into another chamber of the plurality of substrate processing units.

15. A substrate transfer method in a substrate processing apparatus, comprising:

accommodating a substrate in a chamber of at least one substrate processing unit and opening and closing a substrate loading/unloading port of the chamber by an opening/closing member;

detecting a substrate advanced or retreated through the substrate loading/unloading port by a substrate detection sensor positioned to detect when the substrate is extracted from one chamber of the plurality of substrate processing units and does not interfere with the opening/closing member and the substrate loading/unloading port to generate a trigger signal;

performing a predetermined process on the substrate in the chamber by each of the plurality of substrate processing units;

using a transfer unit including at least two arms respectively configured to hold the substrate and be independently extendable and contractible, performing a rotating operation and/or a lifting operation for loading and unloading a substrate into and from the chamber using the arms; and controlling, when the trigger signal caused by substrate extraction by one of the at least two arms is generated, the transfer unit to initiate the rotating operation or the lifting operation for loading a substrate held by the other of the at least two arms into the chamber.

16. A substrate transfer method in a substrate processing apparatus, comprising:

performing a predetermined process on a substrate in a chamber accommodating a substrate by a substrate processing unit;

accommodating the substrate in a substrate accommodating chamber to load a substrate to be processed in the substrate processing unit from the outside and to unload a substrate which has been processed in the substrate processing unit to the outside;

performing, by a transfer unit, a rotating operation and/or a sliding operation and an extending/contracting operation for selectively accessing the substrate processing unit and the substrate accommodating chamber;

opening and closing a substrate loading/unloading port of the substrate accommodating chamber by a substrate accommodating chamber opening/closing member;

opening and closing a substrate loading/unloading port of the chamber by a chamber opening/closing member;

detecting a substrate advanced and retreated through the substrate loading/unloading port of the substrate accommodating chamber by a first substrate detection sensor positioned to detect when the substrate is extracted from the substrate accommodating chamber and does not interfere with the substrate accommodating chamber opening/closing member and the substrate loading/unloading port of the substrate accommodating chamber to generate a first trigger signal; and detecting a substrate advanced and retreated through the substrate loading/unloading port of the chamber by a second substrate detection sensor positioned to detect when the substrate is extracted from the chamber of the substrate processing unit and does not interfere with the chamber opening/closing member and the substrate loading/unloading port of the chamber to generate a second trigger signal; and controlling, when the first trigger signal is generated, the transfer unit to initiate the rotating operation or the sliding operation for transferring the substrate extracted from the substrate accommodating chamber into the chamber; and, when the second trigger signal is generated, controlling the transfer unit to initiate the rotating operation or the sliding operation for transferring the substrate extracted from the chamber into the substrate accommodating chamber.

17. A substrate transfer method in a substrate processing apparatus, comprising:

accommodating a substrate in a chamber in a substrate processing unit performing a predetermined process on the substrate;

accommodating the substrate in a substrate accommodating chamber to load a substrate to be processed in the substrate processing unit from the outside and to unload a substrate which has been processed in the substrate processing unit to the outside;

opening and closing a substrate loading/unloading port of the substrate accommodating chamber by an opening/closing member;

using a transfer unit including at least two arms respectively configured to hold the substrate and be independently extendable and contractible, performing a rotating operation and/or a lifting operation for loading and unloading the substrate into and from the chamber and the substrate accommodating chamber by the transfer unit;

detecting a substrate advanced and retreated by the transfer unit, through the substrate loading/unloading port of the substrate accommodating chamber by using a substrate detection sensor positioned to detect when the substrate is extracted from the substrate accommodating chamber and does not interfere with the opening/closing member and the substrate loading/unloading port of the substrate accommodating chamber to generate a trigger signal; and controlling, when the trigger signal caused by substrate extraction by one of the at least two arms is generated, the transfer unit to initiate the rotating operation or the lifting operation for loading a substrate held by the other of the at least two arms into the substrate accommodating chamber.

* * * * *